(12) United States Patent
Kang et al.

(10) Patent No.: US 12,049,001 B2
(45) Date of Patent: Jul. 30, 2024

(54) ROBOT COMPRISING ARM UNIT OF LENGTH VARIABLE STRUCTURE

(71) Applicant: Samsung Electronics Co., Ltd., Gyeonggi-do (KR)

(72) Inventors: Yonghun Kang, Gyeonggi-do (KR); Kyungshik Roh, Gyeonggi-do (KR); Sangjun Jung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 244 days.

(21) Appl. No.: 17/685,492

(22) Filed: Mar. 3, 2022

(65) Prior Publication Data

US 2022/0184820 A1 Jun. 16, 2022

Related U.S. Application Data

(63) Continuation of application No. PCT/KR2020/011849, filed on Sep. 3, 2020.

(30) Foreign Application Priority Data

Sep. 5, 2019 (KR) ......................... 10-2019-0109974

(51) Int. Cl.
  B25J 18/02 (2006.01)
  B25J 9/10 (2006.01)
  (Continued)

(52) U.S. Cl.
  CPC ............. B25J 18/025 (2013.01); B25J 9/102 (2013.01); B25J 9/105 (2013.01); H02K 7/116 (2013.01); H02K 7/14 (2013.01); H05K 1/0277 (2013.01)

(58) Field of Classification Search
  CPC ........ F16H 25/12; F16H 31/004; B25J 18/02; B25J 18/025; B25J 9/109
  See application file for complete search history.

(56) References Cited

U.S. PATENT DOCUMENTS

| 5,078,021 A | 1/1992 | Freywiss |
| 9,999,152 B2 | 6/2018 | Kang et al. |

(Continued)

FOREIGN PATENT DOCUMENTS

| JP | 2001-260070 A | 9/2001 |
| JP | 2001260070 A * | 9/2001 |

(Continued)

OTHER PUBLICATIONS

Machine translation of JP 2001-260070 (Year: 2001).*

*Primary Examiner* — Randell J Krug
(74) *Attorney, Agent, or Firm* — Cha & Reiter, LLC

(57) ABSTRACT

Disclosed is a robot including a variable length unit coupled to one section of at least one arm unit, wherein the variable length unit may include a motor, a first cam having at least one slit having a specific inclination in one area thereof, and a second cam, at least a portion of which is disposed in an interior of the first cam, and having at least one first boss that passes through the at least one slit of the first cam, wherein the first cam may be rotated through driving of the motor, the second cam may be linearly moved while the at least one first boss is guided by the at least one slit in correspondence to rotation of the first cam, and a length of the at least one arm unit may vary in correspondence to linear motion of the second cam.

13 Claims, 9 Drawing Sheets

(51) Int. Cl.
    *H02K 7/116*     (2006.01)
    *H02K 7/14*     (2006.01)
    *H05K 1/02*     (2006.01)

(56) References Cited

U.S. PATENT DOCUMENTS

| | | | |
|---|---|---|---|
| 11,627,976 B2 * | 4/2023 | Kobayashi | A61B 17/29 |
| | | | 606/205 |
| 11,813,967 B2 * | 11/2023 | Hofschulte | F16H 37/124 |
| 2011/0241369 A1 | 10/2011 | Kamon et al. | |

FOREIGN PATENT DOCUMENTS

| | | |
|---|---|---|
| KR | 10-2010-0128560 A | 12/2010 |
| KR | 10-2011-0094083 A | 8/2011 |
| KR | 10-1395140 B1 | 5/2014 |
| KR | 10-2017-0106826 A | 9/2017 |
| WO | 2019/116415 A1 | 6/2019 |

* cited by examiner

ROBOT COMPRISING ARM UNIT OF LENGTH VARIABLE STRUCTURE

CROSS-REFERENCE TO RELATED APPLICATION(S)

This application is a continuation of International Application No. PCT/KR2020/011849, filed on Sep. 3, 2020, which claims priority to Korean Patent Application No. 10-2019-0109974, filed on Sep. 5, 2019 in the Korean Intellectual Property Office, the disclosures of which are herein incorporated by reference.

TECHNICAL FIELD

One or more embodiments disclosed in the disclosure relate to a robot including an arm unit of a variable length structure.

BACKGROUND

With the advent of the industrial developments and consolidation of a wide range of technologies, automation systems designed to perform a function with minimal or no human intervention have been readily available in various industrial fields. Automation systems, i.e., robots with a primary focus on arms and actuators perform various manufacturing operations in order to enhance the productivity and reduce errors.

The robots may be designed to have suitable operation ranges in a given operation environment. For example, a length of an arm provided in the robot may be determined based on a load or a transportation distance of an operation target, thus an operation range of the robot that is proportional to the length of the arm deployed.

An operation environment of the robot may be varied to cover different products or process lines. To this end, the operation range of the robot also may be required to be changed when the operation environment changes. To address this, a technology for adjusting an operation range of the robot by changing a length of an arm of the robot using a linear motion guide or a telescopic cylinder has been suggested. However, the above-described technology cannot easily perform with a precision as the length of the arm of the robot is changed based on a hydraulic or pneumatic pressure. There is also a drawback of needing a separate device for supplying the hydraulic or pneumatic pressure which in turn restricts the operation of robots in a narrow and or tight space.

SUMMARY

Certain embodiments disclosed in the disclosure may provide a robot including an arm unit of a variable length structure, by which a length of a robot arm may be adjusted based on a structural modification implemented in one section of the robot arm.

In an embodiment, a robot may include at least one arm unit, and a variable length unit coupled to one section of the at least one arm unit.

In an embodiment, the variable length unit may include a motor, a first cam having at least one slit having a specific inclination in one area thereof, and a second cam, at least a portion of which is disposed in an interior of the first cam, and having at least one first boss that passes through the at least one slit of the first cam.

In an embodiment, the first cam may be rotated through driving of the motor, the second cam may be linearly moved while the at least one first boss is guided by the at least one slit in correspondence to rotation of the first cam, and a length of the at least one arm unit may vary in correspondence to linear motion of the second cam.

In an embodiment, a robot may include a main printed circuit board, a controller electrically connected to the main printed circuit board, at least one arm unit, and a variable length unit coupled to one section of the at least one arm unit.

In an embodiment, the variable length unit may further include a motor, a flexible printed circuit board connected to the motor and the main printed circuit board, a first cam having at least one slit having a specific inclination in one area thereof, and a second cam, at least a portion of which is disposed in an interior of the first cam, and having at least one first boss that passes through the at least one slit of the first cam.

In an embodiment, the first cam may be rotated through driving of the motor, the second cam may be linearly moved while the at least one first boss is slid in the at least one slit in correspondence to rotation of the first cam, and a length of the at least one arm unit may be changed between a first length and a second length that is smaller than the first length in correspondence to linear motion of the second cam.

According to Certain embodiments, the length of the robot arm may be flexibly changed through a structural modification of the variable length unit coupled to one section of the robot arm whereby adjustment of an operation range of the robot, which is optimized for an operation environment, may be supported.

In addition, the disclosure may provide various effects that are directly or indirectly recognized.

DESCRIPTION OF DRAWINGS

In relation to the description of the drawings, the same reference numerals may be given to the same or corresponding elements.

DETAILED DESCRIPTION

Hereinafter, certain embodiments disclosed in the disclosure will be described with reference to the accompanying drawings. However, this is not intended to limit the disclosure to the specific embodiments, and it is to be construed to include various modifications, equivalents, and/or alternatives of embodiments of the disclosure.

Figure 1:
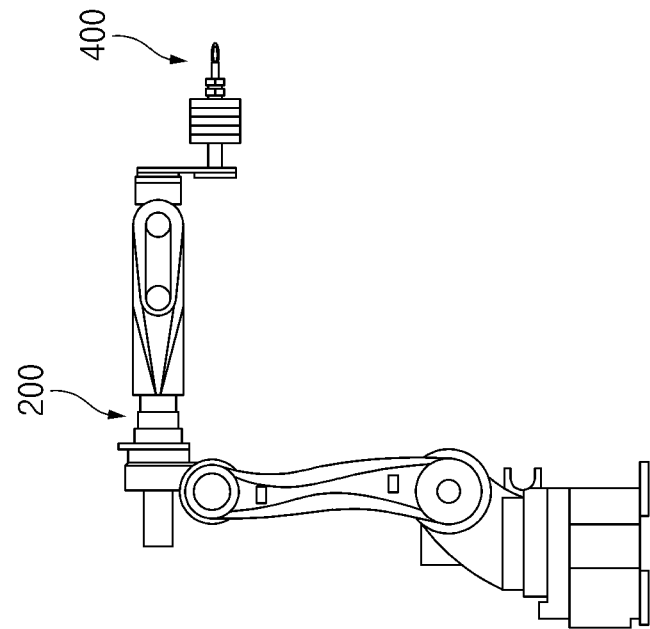
FIG. 1 is a view illustrating a robot and an example of an operation of the robot according to an embodiment.
Figure 1:
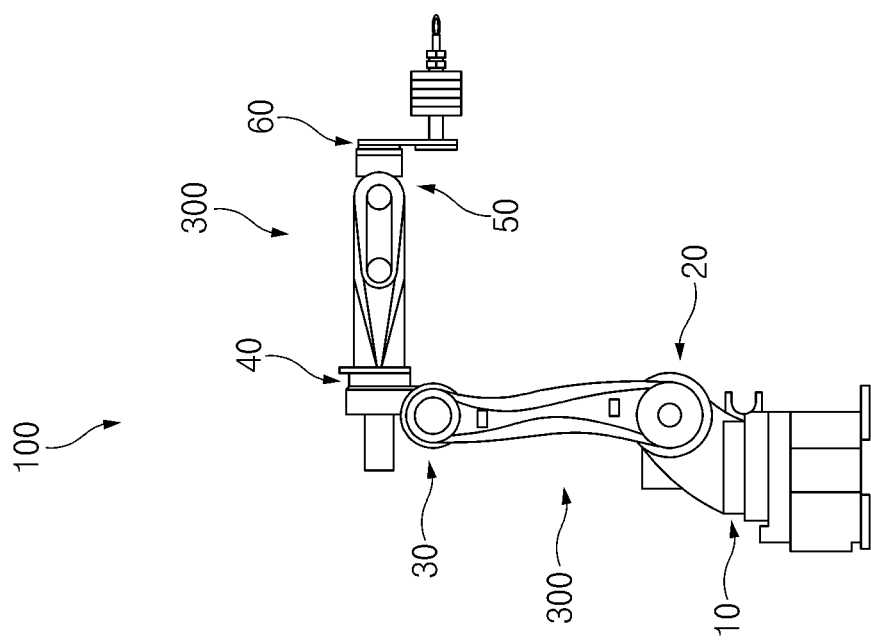

FIG. 1 is a view illustrating a robot and an example of an operation of the robot according to an embodiment.

Referring to FIG. 1, a robot 100 according to an embodiment may include a plurality of arm units 300, and a header 400 provided at a distal end area of one side of the robot 100 and in relation to an operation target member or an operation target site during operation. To this end, the robot 100 may include a plurality of joint shafts that are selectively rotated in specific directions. For example, the robot 100 may include the joint shafts including a first shaft 10, a second shaft 20, a third shaft 30, a fourth shaft 40, a fifth shaft 50, and a sixth shaft 60. As shown, the plurality of arm units 300 may be disposed between some of these joint shafts. For example, the plurality of arm units 300 may be disposed between some joint shafts to be directly or indirectly connected to a servo motor (not illustrated).

In an embodiment, a variable length unit 200 that supports a variation of the arm unit 300 lengthwise may be disposed in at least some of the plurality of arm units 300. For example, in one section of the arm unit 300 disposed between the fourth shaft 40 and the fifth shaft 50, the variable length unit 200 be structurally manipulated to extend or change the length of the arm unit 300. The variable length unit 200 may vary the length of the arm unit 300 between a first length (e.g., a variable maximum length) and a second length (e.g., a variable minimum length) that is shorter than the first length. Furthermore, it should be noted that according to the teachings of present disclosure, the variable length unit 200 may be provided or further provided in another arm unit 300 disposed between other shafts, to achieve the same operation of changing the length of the another arm unit 300. Alternatively, the variable length unit 200 may be integrally formed with the arm unit 300, in which the variable length unit 200 is disposed. Yet in another embodiment, the variable length unit 200 may be coupled to one section of the corresponding arm unit 300 through a coupling member such as a bearing.

According to certain embodiments, the robot 100 may be fixed to a ground surface or may include at least one steering apparatus to be roamed during operation. According to certain embodiments, various tools may be detachably coupled to the header 400 of the robot 100 depending on the required operations (e.g., assembling, transportation, welding, or injection-molding of an operation target) performed by the robot 100.

Figure 2:
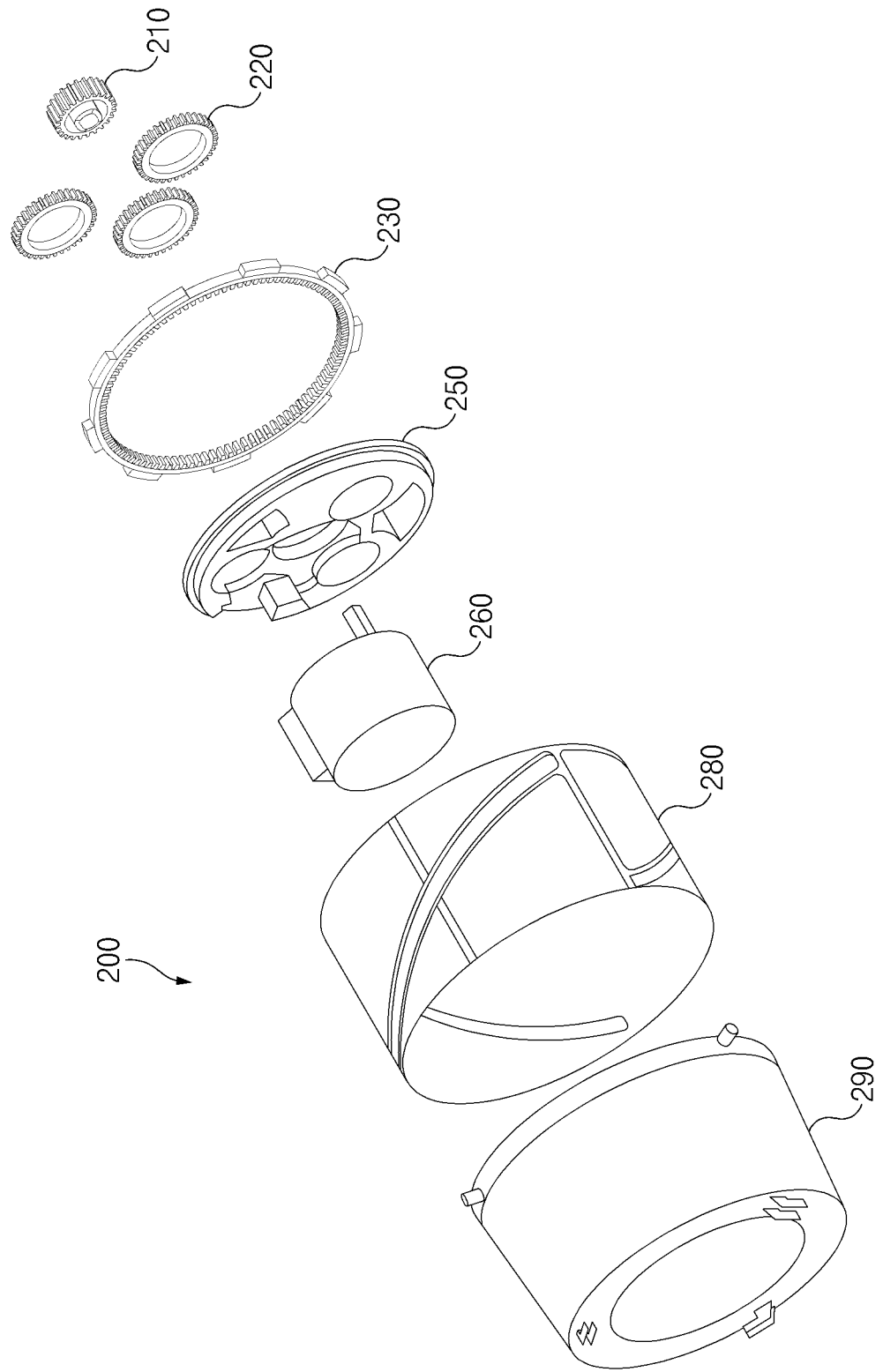
FIG. 2 is a view illustrating a configuration of a variable length unit according to an embodiment.

FIG. 2 is a view illustrating a configuration of a variable length unit according to an embodiment.

Referring to FIG. 2, the variable length unit 200 according to the embodiment may include a first gear 210, at least one second gear 220, a third gear 230, a plate 250, a motor 260, a first cam 280, and a second cam 290. In certain embodiments, the variable length unit 200 may exclude at least one of the above-described elements or may additionally include another element. For example, the variable length unit 200 may further include a flexible printed circuit board that is electrically connected to the motor 260. In this regard, a main printed circuit board may be included in one area of an interior of a robot (e.g., the robot 100), and the flexible printed circuit board and the main printed circuit board may be electrically connected to each other. In an embodiment, a controller (e.g., a processor) that controls an overall operation of the robot 100 may be mounted to be electrically connected to the main printed circuit board, and a driving signal of the motor 260, under the control of the controller, may be delivered to the motor 260 through the main printed circuit board and the flexible printed circuit board. In an embodiment, the controller may deliver a different driving signal to the motor 260 for controlling a length of the arm unit (e.g., the arm unit 300 of FIG. 1) of the robot 100. For example, when an entire length of the arm unit 300 is to be controlled to extend to a first length, the controller may deliver a driving signal for rotating the motor 260 in a first direction to the motor 260 through the main printed circuit board and the flexible printed circuit board. Furthermore, when the entire length of the arm unit 300 is controlled to extend to a second length that is shorter than the first length, the controller may deliver a driving signal for rotating the motor 260 in a second direction that is opposite to the first direction to the motor 260.

Figure 3:
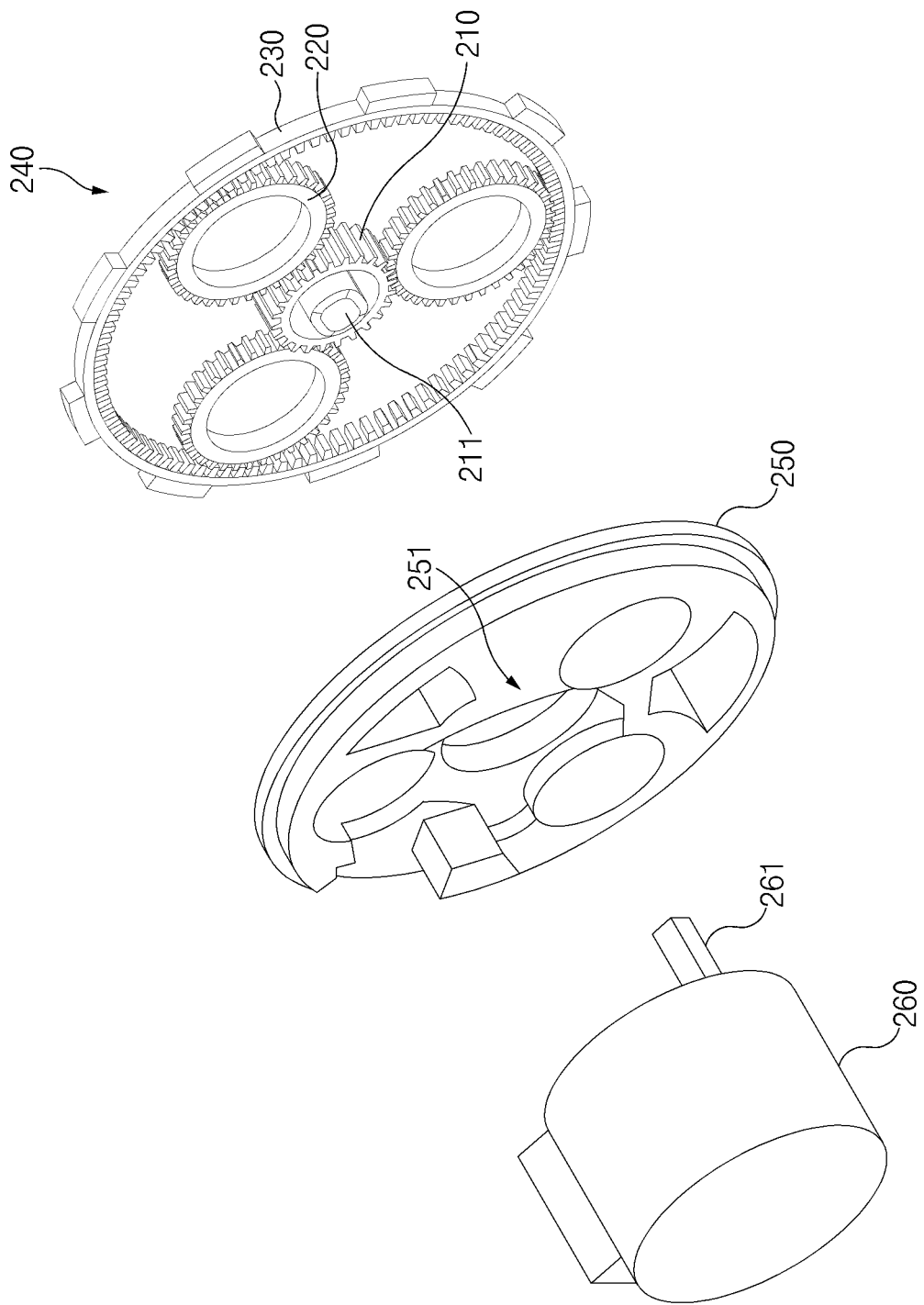
FIG. 3 is a view illustrating a coupling structure of a gear assembly, a plate, and a motor according to an embodiment.

FIG. 3 is a view illustrating a coupling structure of a gear assembly, a plate, and a motor according to an embodiment.

Referring to FIGS. 2 and 3, at least portions of the first gear 210, the at least one second gear 220, and the third gear 230 according to the embodiment may be engaged with and coupled to each other. For example, the at least one second gear 220 may be disposed to be engaged with at least a portion of an outer surface of the first gear 210, and the third gear 230 may be disposed to be engaged with at least a portion of an outer surface of the at least one second gear 220 to surround the at least one second gear 220. As shown, the first gear 210 and the at least one second gear 220 may include a plurality of teeth on outer surfaces thereof. The third gear 230 may include a plurality of teeth on an inner surface thereof.

In an embodiment, a gear assembly 240, in which the first gear 210, the at least one second gear 220, and the third gear 230 are coupled to each other, may be supported by the plate 250 of an extent, by which a diameter of the third gear 230 may be covered. For example, a first surface of the plate 250, which faces the gear assembly 240, may be coupled to at least a portion of an edge area of the third gear 230 to support the gear assembly 240.

In an embodiment, the motor 260 may be disposed to contact a second surface that is opposite to first surface of the plate 250 or to be spaced apart from the second surface by a specific interval. According to an embodiment, the motor 260 may include a motor shaft 261 that is rotated in the first direction or the second direction that is opposite to the first direction according to a driving signal delivered from the controller. The motor shaft 261 may pass through an opening 251 formed in a central area of the plate 250 to be inserted into and fixed to a coupling recess 211 formed in a central area of the first gear 210. As a result, when the motor shaft 261 is rotated in the first direction through driving of the motor 260, the first gear 210 fixed to the motor shaft 261 may be rotated in the first direction in correspondence to rotation of the motor shaft 261, the at least one second gear 220 engaged with the first gear 210 may be rotated in the second direction in correspondence to rotation of the first gear 210, and the third gear 230 engaged with the at least one second gear 220 may be rotated in the second direction in correspondence to rotation of the at least one second gear 220. Reversely, when the motor shaft 261 is rotated in the second direction through driving of the motor 260, the first gear 210 may be rotated in the second direction in correspondence to rotation of the motor shaft 261, the at least one second gear 220 may be rotated in the first direction in correspondence to rotation of the first gear 210, and the third gear 230 may be rotated in the first direction in correspondence to rotation of the at least one second gear 220.

Figure 4:
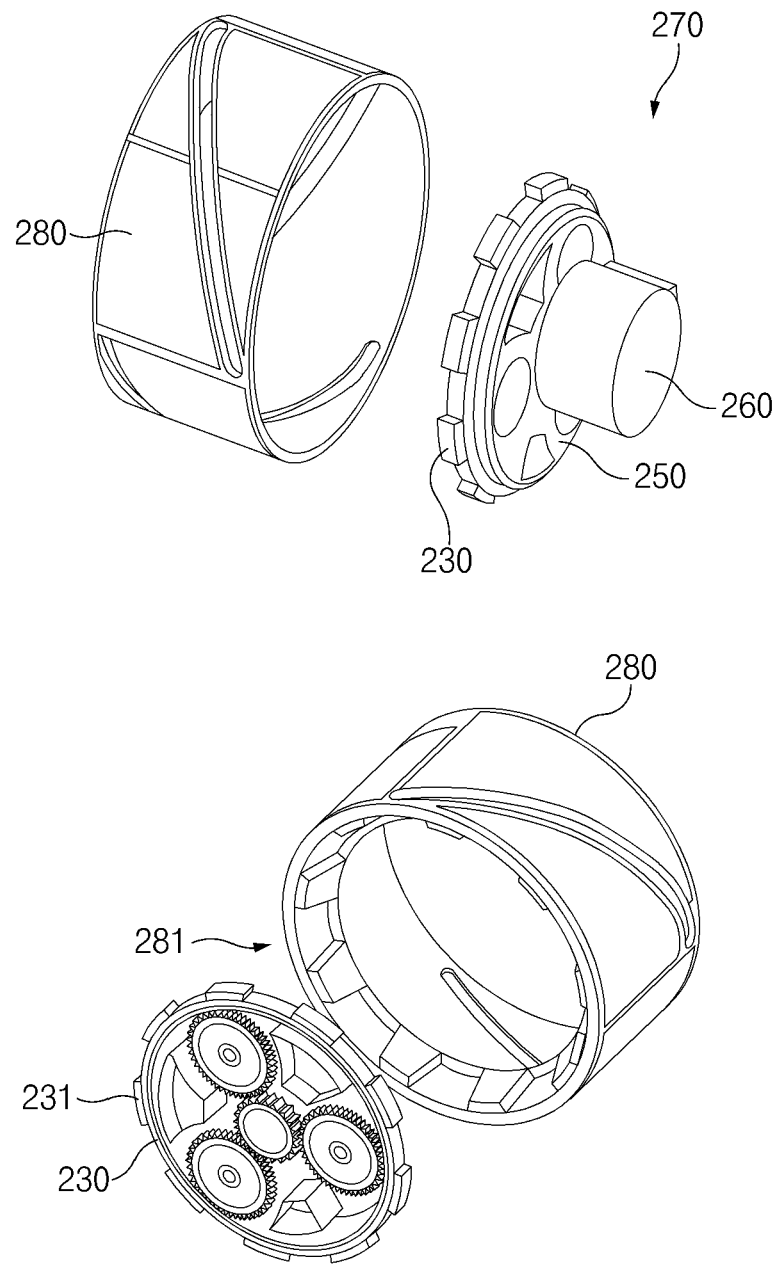
FIG. 4 is a view illustrating a coupling structure of a rotation assembly and a first cam according to an embodiment.

FIG. 4 is a view illustrating a coupling structure of a rotation assembly and a first cam according to an embodiment.

Referring to FIGS. 2 and 4, a rotation assembly 270, in which the gear assembly (e.g., the gear assembly 240 of FIG. 3), the plate 250, the motor 260 are coupled to each other, may be coupled to the first cam 280 having a cylindrical shape, an interior of which is opened. For example, the rotation assembly 270 may be disposed in an interior of the first cam 280 such that at least a portion of the opened interior of the first cam 280 may be closed with respect to one direction by the gear assembly 240.

According to an embodiment, in relation to coupling of the rotation assembly 270 and the first cam 280, a plurality of bosses 231 spaced apart from each other circumferentially by a specific interval may be included on an outer surface of the third gear 230 included in the rotation assembly 270, and a plurality of recesses 281 formed (e.g., engraved) in a shape (or a volume) corresponding to the plurality of bosses 231 of the third gear 230 may be included on an inner surface of the first cam 280. In an embodiment, when the rotation assembly 270 is disposed, the plurality of bosses 231 of the third gear 230 may be inserted into the plurality of recesses 281 of the first cam 280, and accordingly, the rotation assembly 270 may be disposed to be engaged with the first cam 280 in an interior of the first cam 280. According to certain embodiments, to separate the plurality of bosses 231 from the plurality of recesses 281, the plurality of bosses 231 may be fixed to an inner surface of the first cam 280 through a coupling member such as a bolt in a state, in which they are inserted into the plurality of recesses 281.

In an embodiment, the first cam 280 may be rotated by the third gear 230 of the rotation assembly 270 disposed in an interior thereof. For example, when the third gear 230 is rotated in one direction in association with driving of the motor 260, the plurality of bosses 231 of the third gear 230, which are inserted into the plurality of recesses 281 of the first cam 280, may press an inner surface of the first cam 280, and the first cam 280 may be rotated in the same rotational direction as that of the third gear 230 as the inner surface of the first cam 280 is pressed.

A distal end area (e.g., a distal end area that is adjacent to the rotation assembly 270 coupled to the first cam 280) of one side of the first cam 280 may be coupled to one area of the arm unit (e.g., the arm unit 300 of FIG. 1) of the robot (e.g., the robot 100 of FIG. 1). For example, the distal end area of the one side of the first cam 280 may be coupled to a division area of one side of the arm unit 300 that is articulated such that the variable length unit (e.g., the variable length unit 200 of FIG. 1) is disposed in one section of the arm unit 300.

Figure 5:
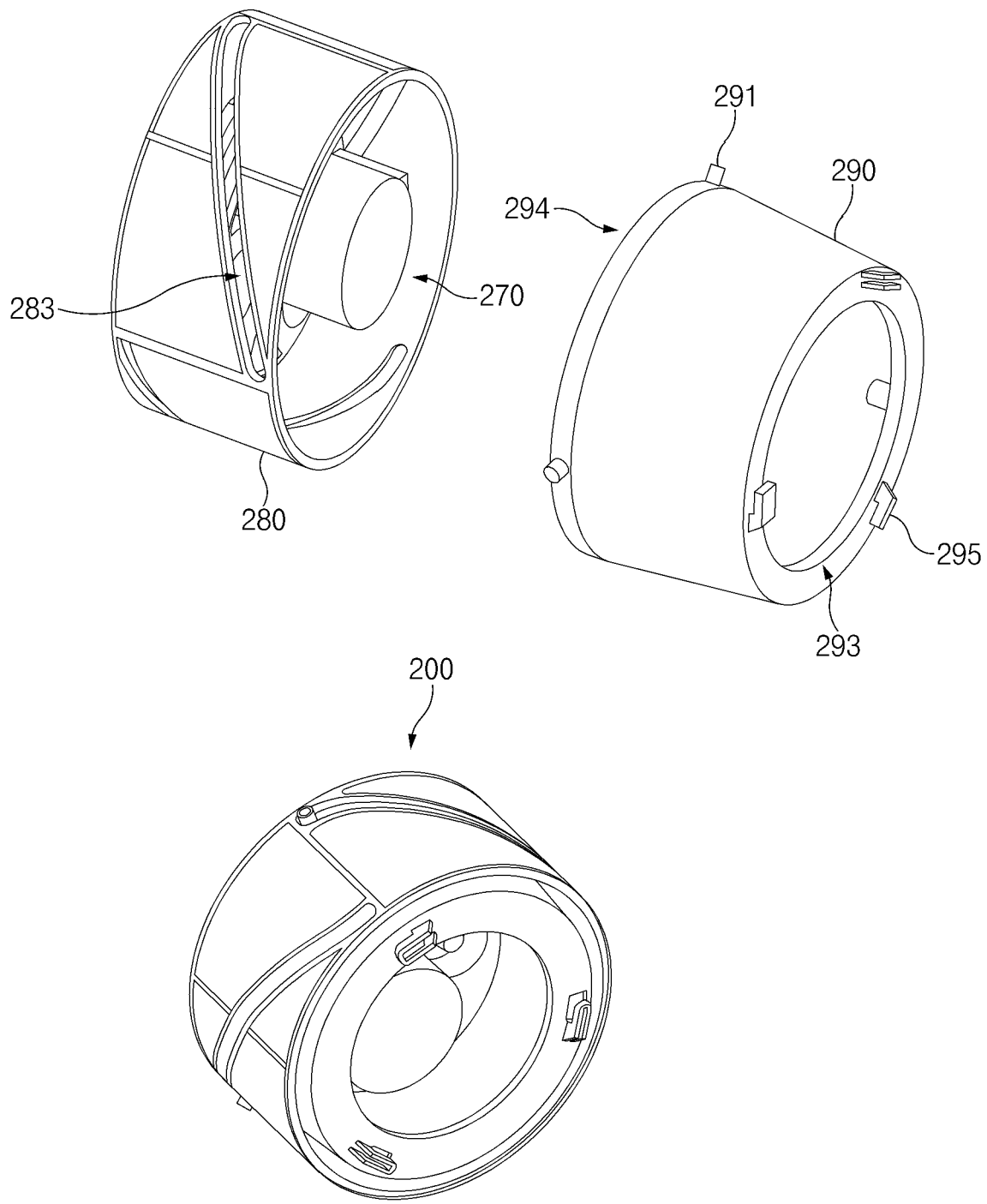
FIG. 5 is a view illustrating a coupling structure of a first cam and a second cam according to an embodiment.
Figure 6:
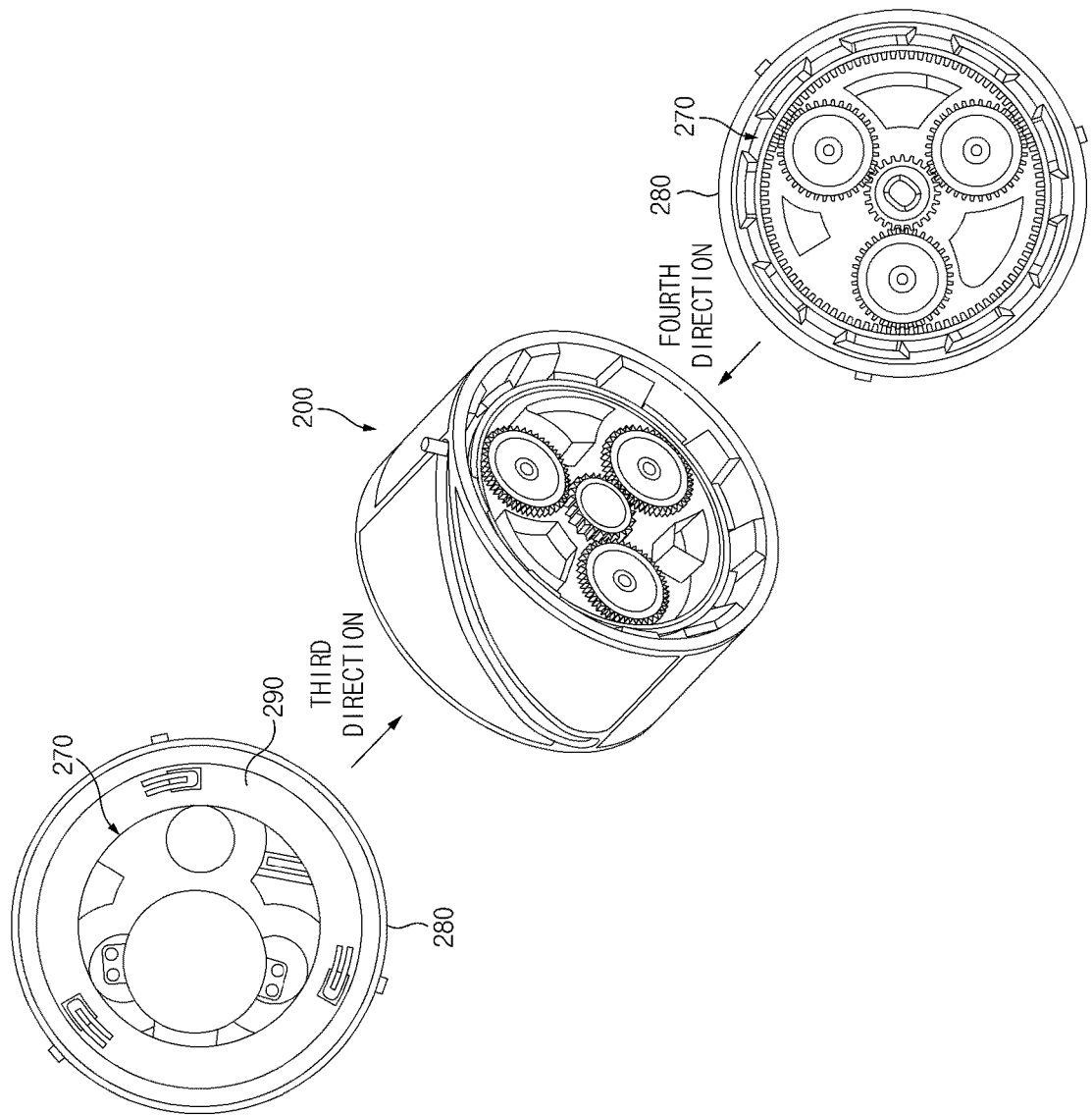
FIG. 6 is a view illustrating a variable length unit, viewed from a third direction and a fourth direction, according to an embodiment.

FIG. 5 is a view illustrating a coupling structure of the first cam and a second cam according to an embodiment. FIG. 6 is a view illustrating the variable length unit, viewed from a third direction and a fourth direction, according to an embodiment.

Referring to FIGS. 2, 5, and 6, the second cam 290 according to the embodiment may have a cylindrical shape, an interior of which is opened, a diameter of a distal end 294 of one side of the cylindrical shape may be smaller than a diameter of the first cam 280, and a diameter of a distal end 293 of an opposite side of the cylindrical shape may be smaller than a diameter of the distal end 294 of the one side.

In an embodiment, at least a portion of the second cam 290 may be inserted into the interior of the first cam 280. For example, the second cam 290 may be inserted into the interior of the first cam 280 such that the distal end 294 of the one side of the second cam 290 contacts a second surface of the plate 250 included in the rotation assembly 270 or is spaced apart from the second surface by a specific interval in a state, in which the first cam 280 and the rotation assembly 270 are coupled to each other.

In an embodiment, when the second cam 290 is inserted into the first cam 280, the first cam 280 and the second cam 290 may be coupled to each other. To this end, the first cam 280 may include at least one slit 283 that has a specific inclination and passes through an outer surface and an inner surface thereof, and the second cam 290 may include at least one boss 291 that protrudes from an area of the distal end 294 of the one side. The at least one boss 291 of the second cam 290, for example, may be inserted to pass through the at least one slit 283 of the first cam 280. In this case, the variable length unit 200, in which the first cam 280, the rotation assembly 270, and the second cam 290 are coupled to each other, may be implemented.

According to an embodiment, as each of the first cam 280 and the second cam 290 has a cylindrical shape, the interior of which is opened, at least a portion of the interior of the variable length unit 200 (or the interior of the first cam 280) may be exposed to the outside. That is, when the variable length unit 200 is viewed from the third direction, at least a portion of the rotation assembly 270 and at least a portion of the second cam 290, which are disposed in the interior of the first cam 280, may be visible. When the variable length unit 200 is viewed from the fourth direction that is opposite to the third direction, at least a portion of the rotation assembly 270 disposed in the interior of the first cam 280 may be viewed.

As shown in FIG. 6, the at least a portion of the second cam 290, which is viewed when the variable length unit 200 is viewed from the third direction, may include the area of the distal end 293 of the opposite side of the second cam 290. The area of the distal end 293 of the opposite side of the second cam 290, for example, may be coupled to a division area of the opposite side of the divided arm unit 300 when the variable length unit 200 is disposed in one section of the arm unit (e.g., the arm unit 300 of FIG. 1) of the robot (e.g., the robot 100 of FIG. 1). Here, the area of the distal end 293 of the opposite side of the second cam 290 may include at least one coupling member 295 (e.g., a hook or a clamp) that supports coupling of the arm unit 300 to the opposite side division area.

Figure 7:
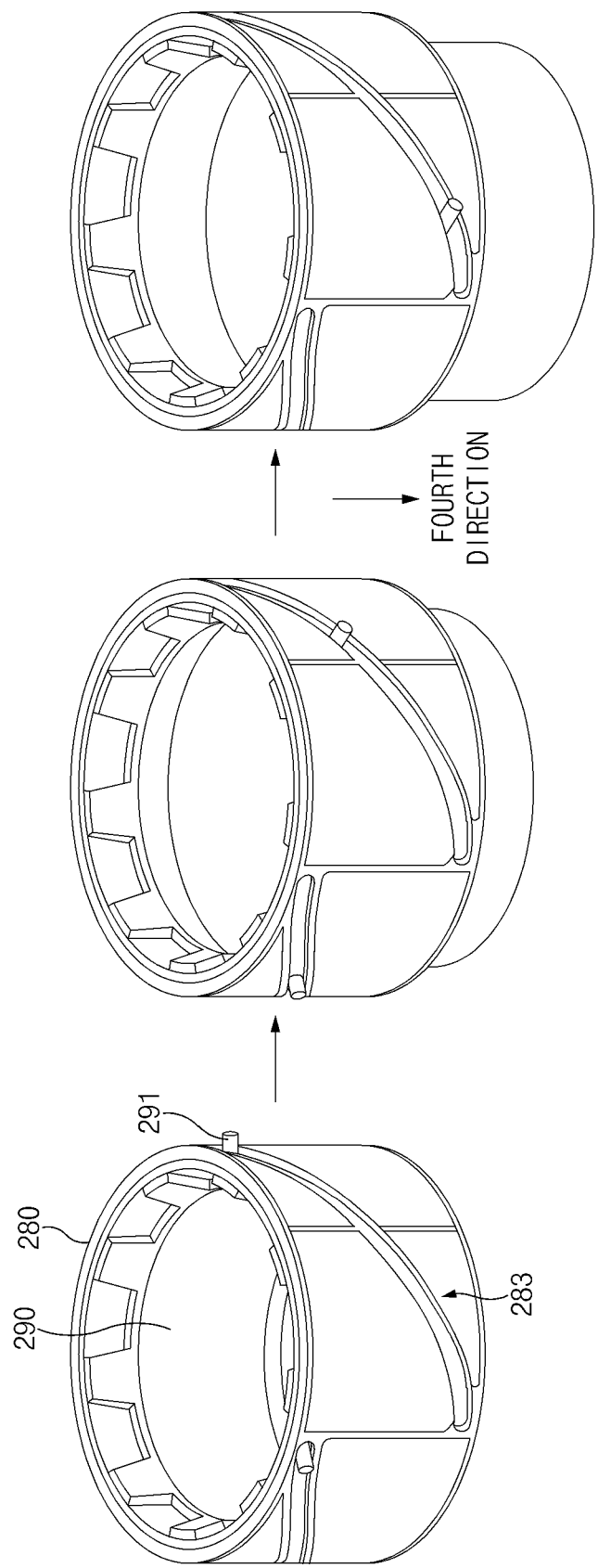
FIG. 7 is a view illustrating a first motion between a first cam and a second cam according to an embodiment.
Figure 8:
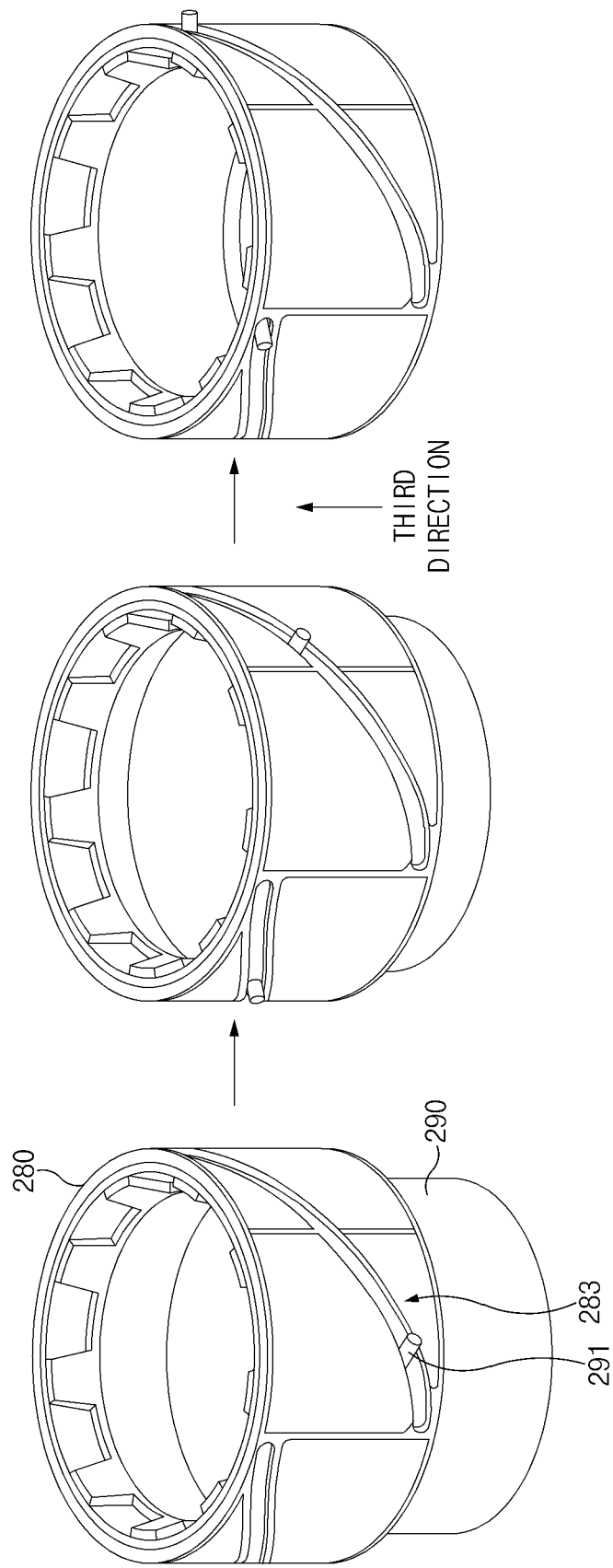
FIG. 8 is a view illustrating a second motion between a first cam and a second cam according to an embodiment.

FIG. 7 is a view illustrating a first motion between a first cam and a second cam according to an embodiment. FIG. 8 is a view illustrating a second motion between a first cam and a second cam according to an embodiment.

In FIGS. 7 and 8, although illustration of the rotation assembly (e.g., the rotation assembly 270 of FIG. 4) disposed in the interior of the first cam is omitted for convenience of clarity and simplicity, the rotation assembly may be coupled to the interior of the first cam as described above, and the following description may be based on the coupled state of the first cam and the rotation assembly.

Referring to FIGS. 2 and 7, when the motor shaft (e.g., the motor shaft 261 of FIG. 3) is rotated in the first direction according to a driving signal delivered from the controller to the motor 260, the first cam 280 and the second cam 290, which are coupled to each other based on the at least one slit 283 and the at least one boss 291, may perform a first motion. The first motion, for example, may be understood as a structural modification of the variable length unit 200, in which the first cam 280 is rotated in the second direction in association with the rotation of the motor shaft 261 in the first direction, the second cam 290 is linearly moved in the fourth direction that is perpendicular to the first direction or the second direction in correspondence to the rotation of the first cam 280 in the second direction, and at least a portion of the second cam 290, which is inserted into the first cam 280, is extracted to the outside of the first cam 280.

According to an embodiment, the linear motion of the second cam 290 in the fourth direction may be based on a slide motion of the at least one boss 291 through the at least one slit 283. In this regard, the first gear 210 fixed to the motor shaft 261 may be rotated in the first direction according to the rotation of the motor shaft 261 in the first direction, at least one second gear 220 engaged with the first gear 210 may be rotated in the second direction, and the third gear 230 engaged with the at least one second gear 220 may be rotated in the second direction. In an embodiment, the rotation of the third gear 230 in the second direction may cause the plurality of bosses (e.g., the plurality of bosses 231 of FIG. 4) of the third gear 230, which are inserted into the plurality of recesses (e.g., the plurality of recesses 281 of FIG. 4) of the first cam 280, to press the inner surface of the first cam 280, and accordingly, the first cam 280 may be rotated in the second direction that is the same as that of the third gear 230. In this operation, due to the rotation of the first cam 280 in the second direction, a relative location between the at least one slit 283 of the first cam 280 and the at least one boss 291 of the second cam 290 may vary. For example, the at least one boss 291 may be constricted and guided by the at least one slit 283 that is rotated in the second direction to be slid in the at least one slit 283 having the specific inclination, and the second cam 290 inserted into the first cam 280 may be linearly moved in the fourth direction based on the slide motion of the at least one boss 291.

In an embodiment, the linear motion of the second cam 290 in the fourth direction may cause at least a portion of the second cam 290, which is inserted into the first cam 280, to be extracted to the outside of the first cam 280, and accordingly, the entire length of the variable length unit 200 may become longer (e.g., the first length) whereby the length of the arm unit (e.g., the arm unit 300 of FIG. 1) of the robot (e.g., the robot 100 of FIG. 1), in which the variable length unit 200 is disposed, may vary (e.g., become longer).

Referring to FIGS. 2 and 8, when the motor shaft (e.g., the motor shaft 261 of FIG. 3) is rotated in the second direction according to a driving signal of the controller in a state, in which the entire length of the variable length unit 200 becomes longer, the first cam 280 and the second cam 290 may perform a second motion. The second motion, for example, may be understood as a structural modification of the variable length unit 200, in which the first cam 280 is rotated in the first direction in association with the rotation of the motor shaft 261 in the second direction, the second cam 290 is linearly moved in the third direction that is opposite to the fourth direction in correspondence to the rotation of the first cam 280 in the first direction, and at least a portion of the second cam 290, which is extracted to the outside of the first cam 280, is introduced into the interior of the first cam 280.

According to an embodiment, the linear motion of the second cam 290 in the third direction may be based on a slide motion of the at least one boss 291 through the at least one slit 283 similarly to the first motion. In this regard, the first gear 210 fixed to the motor shaft 261 may be rotated in the second direction according to the rotation of the motor shaft 261 in the second direction, at least one second gear 220 engaged with the first gear 210 may be rotated in the first direction, and the third gear 230 engaged with the at least one second gear 220 may be rotated in the first direction. In an embodiment, the rotation of the third gear 230 in the first direction may cause the plurality of bosses (e.g., the plurality of bosses 231 of FIG. 4) of the third gear 230, which are inserted into the plurality of recesses (e.g., the plurality of recesses 281 of FIG. 4) of the first cam 280, to press the inner surface of the first cam 280, and accordingly, the first cam 280 may be rotated in the first direction that is the same as that of the third gear 230. In this operation, due to the rotation of the first cam 280 in the first direction, a relative location between the at least one slit 283 of the first cam 280 and the at least one boss 291 of the second cam 290 may vary. For example, the at least one boss 291 may be constricted and guided by the at least one slit 283 that is rotated in the first direction to be slid in the at least one slit 283 having the specific inclination, and the second cam 290, at least a portion of which is extracted to the outside of the first cam 280, may be linearly moved in the third direction based on the slide motion of the at least one boss 291.

In an embodiment, the linear motion of the second cam 290 in the third direction may cause at least a portion of the second cam 290, which is extracted to the outside of the first cam 280, to be inserted into the interior of the first cam 280, and accordingly, the entire length of the variable length unit 200 may be restored to a length before the prolongation (e.g., the second length) whereby the length of the arm unit (e.g., the arm unit 300 of FIG. 1) of the robot (e.g., the robot 100 of FIG. 1), in which the variable length unit 200 is disposed, may vary (e.g., become shorter).

Figure 9:
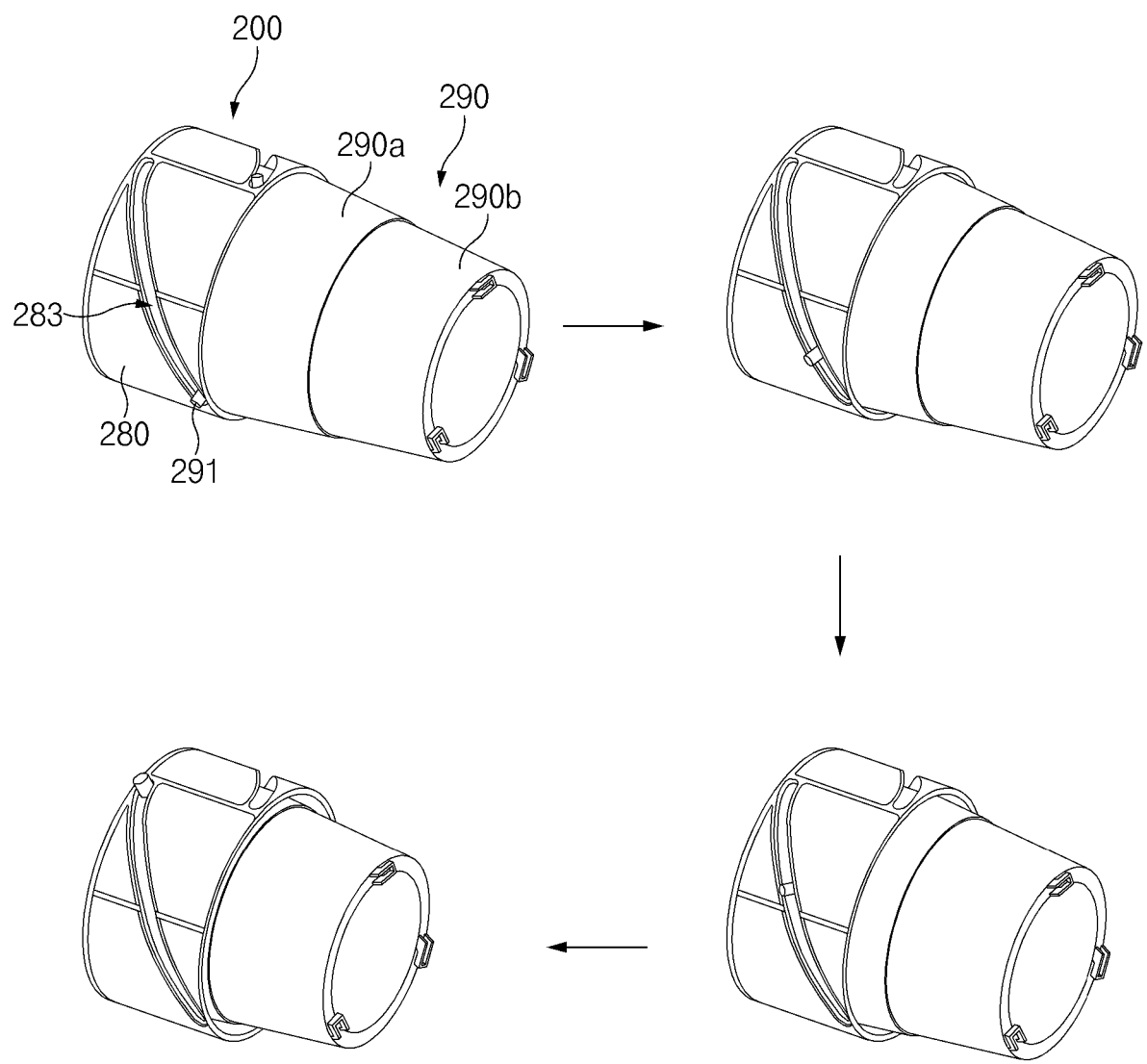
FIG. 9 is a view illustrating a variable length unit according to certain embodiments.

FIG. 9 is a view illustrating a variable length unit according to Certain embodiments.

Referring to FIG. 9, in certain embodiments, the variable length unit 200 may include the first cam 280 and a rotation assembly (e.g., the rotation assembly 270 of FIG. 4) (not illustrated) including structures that are the same as or similar to those described above, and a multi-stepped second cam 290 coupled to the first cam 280. According to certain embodiments, the multi-stepped second cam 290 may include a plurality of sub-cams connected to each other. For example, the multi-stepped second cam 290 may include a first sub-cam 290a, at least a portion of which is inserted into the interior of the first cam 280, and a second sub-cam 290b connected to a distal end of the first sub-cam 290a.

According to certain embodiments, distal ends of opposite sides of the first sub-cam 290a may be narrower than a diameter of the first cam 280 whereby at least portions thereof may be inserted into the interior of the first cam 280, and the at least one boss 291 formed in an area of a distal end of one side, which faces the interior of the first cam 280, may be inserted into the at least one slit 283 formed in the first cam 280 to be coupled to the first cam 280. In certain embodiments, the second sub-cam 290b may be connected to a distal end of an opposite side of the first sub-cam 290a in a form, in which the second sub-cam 290b is coupled to or integral with the first sub-cam 290a. For example, a diameter of a distal end of one side of the second sub-cam 290b may be similar to a diameter of a distal end of an opposite side of the first sub-cam 290a, and the second sub-cam 290b may be connected to the first sub-cam 290a to be aligned with an outer surface of the first sub-cam 290a. The second sub-cam 290b, for example, may be exposed to the outside of the first cam 280, and the area of the distal end of the opposite side of the second sub-cam 290b may be coupled to a division area of the opposite side of the divided arm unit 300 when the variable length unit 200 is disposed in one section of the arm unit (e.g., the arm unit 300 of FIG. 1) of the robot (e.g., the robot 100 of FIG. 1).

In certain embodiments, the second sub-cam 290b may not be aligned with the outer surface of the first sub-cam 290a, and at least a portion thereof may be inserted into the interior of the first sub-cam 290a. For example, a diameter of the distal end of the one side of the second sub-cam 290b may be smaller than a diameter of the distal end of the opposite side of the first sub-cam 290a, and at least a portion of the second sub-cam 290b may be inserted into the first sub-cam 290a in a form, in which the second sub-cam 290b is folded with the first sub-cam 290a. In certain embodiments, the first sub-cam 290a may include a structure that may push out or pull the second sub-cam 290b inserted into the interior thereof. Based on this, the second sub-cam 290b may slide in the interior of the first sub-cam 290a. For example, when the first sub-cam 290a is linearly moved in the fourth direction to be extracted to the outside of the first cam 280 as the first cam 280 is rotated in the second direction, the first sub-cam 290a may push out the second sub-cam 290b inserted into the interior thereof to extract the second sub-cam 290b. For example, when the first sub-cam 290a is linearly moved in the third direction to be inserted into the interior of the first cam 280 as the first cam 280 is rotated in the first direction, the first sub-cam 290a may pull the extracted second sub-cam 290b to insert the second sub-cam 290b.

In certain embodiments, one or a plurality of second sub-cams 290b may be formed. When the plurality of second sub-cams 290b are implemented, the plurality of second sub-cams 290b may be continuously connected to each other in a form, in which outer surfaces thereof are aligned with each other, or may be connected to each other in a form, in which adjacent ones of the second sub-cams 290b are folded with each other.

A robot (e.g., the robot 100) according to the above-described certain embodiments may include at least one arm unit (e.g., the arm unit 300), and a variable length unit (e.g., the variable length unit 200) coupled to one section of the at least one arm unit.

According to certain embodiments, the variable length unit may include a motor (e.g., the motor 260), a first cam (e.g., the first cam 280) having at least one slit having a specific inclination in one area thereof, and a second cam (e.g., the second cam 290), at least a portion of which is disposed in an interior of the first cam, and having at least one first boss that passes through the at least one slit of the first cam.

According to certain embodiments, the first cam may be rotated through driving of the motor, the second cam may be linearly moved while the at least one first boss (e.g., the at least one boss 291) is guided by the at least one slit in correspondence to rotation of the first cam, and a length of the at least one arm unit may vary in correspondence to linear motion of the second cam.

According to certain embodiments, the variable length unit may further include a first gear (e.g., the first gear 210) connected to the motor, at least one second gear (e.g., the at least one second gear 220) disposed to be engaged with at least a portion of an outer surface of the first gear, and a third gear (e.g., the third gear 230) disposed to be engaged with at least a portion of the at least one second gear to surround the at least one second gear.

According to certain embodiments, the third gear may include a plurality of second bosses (e.g., the plurality of bosses 230) formed on an outer surface thereof to be spaced apart from each other, the first cam may include a plurality of recesses corresponding to the plurality of second bosses, on an inner surface thereof, and a gear assembly, in which the first gear, the at least one second gear, and the third gear are coupled to each other, may be coupled to an interior of the first cam by inserting the plurality of second bosses into the plurality of recesses.

According to certain embodiments, the first gear may be rotated in one direction through the driving of the motor, the at least one second gear may be rotated in an opposite direction to the one direction in correspondence to rotation of the first gear in the one direction, the third gear may be rotated in the opposite direction in correspondence to rotation of the at least one second gear in the opposite direction, and the first cam may be pressed by the plurality of second bosses as the third gear is rotated in the opposite direction to be rotated in the opposite direction.

According to certain embodiments, the at least one first boss may be slid in the at least one slit in correspondence to the rotation of the first cam in the opposite direction, and the second cam may be linearly moved in a direction that is perpendicular to the one direction or the opposite direction based on slide motion of the at least one first boss.

According to certain embodiments, the second cam may be moved between a location, at which the second cam is extracted to an outside of the first cam, and a location, at which the second cam is inserted into the interior of the first cam, through linear motion in the direction that is perpendicular to the one direction or the opposite direction.

According to certain embodiments, a length of the at least one arm unit may be changed to a first length by the second cam that is extracted to the outside of the first cam.

According to certain embodiments, a length of the at least one arm unit may be changed to a second length that is smaller than the first length by the second cam that is inserted into the interior of the first cam.

According to certain embodiments, the variable length unit may further include a plate coupled to at least a portion of an edge of the third gear, and that supports a gear assembly, in which the first gear, the at least one second gear, and the third gear are coupled to each other.

According to certain embodiments, the motor may include a motor shaft, and the motor shaft may pass through an opening formed in a central area of the plate and is fixed to a coupling recess formed in a central area of the first gear.

According to certain embodiments, the first cam may include a first cylindrical shape, an interior of which is opened, and the second cam may include a second cylindrical shape having a diameter that is smaller than a diameter of the first cylindrical shape and an interior of which is opened.

According to certain embodiments, a distal end area of one side of the second cam may include at least one coupling member that is coupled to one section of the at least one arm unit.

A robot (e.g., the robot 100) according to the above-described certain embodiments may include a main printed circuit board, a controller electrically connected to the main printed circuit board, at least one arm unit (e.g., the arm unit 300), and a variable length unit (e.g., the variable length unit 200) coupled to one section of the at least one arm unit.

According to certain embodiments, the variable length unit may further include a motor (e.g., the motor 260), a flexible printed circuit board connected to the motor and the main printed circuit board, a first cam (e.g., the first cam 280) having at least one slit having a specific inclination in one area thereof, and a second cam (e.g., the second cam 290), at least a portion of which is disposed in an interior of the first cam, and having at least one first boss that passes through the at least one slit of the first cam.

According to certain embodiments, the first cam may be rotated through driving of the motor, the second cam may be linearly moved while the at least one first boss is slid in the at least one slit in correspondence to rotation of the first cam, and a length of the at least one arm unit may be changed according to linear motion of the second cam.

According to certain embodiments, the controller may, in relation to the change to the first length of the at least one arm unit, deliver a first signal to the motor by using the main printed circuit board and the flexible printed circuit board such that the motor is rotated in a first direction.

According to certain embodiments, the controller may, in relation to the change to the second length of the at least one arm unit, deliver a second signal to the motor by using the main printed circuit board and the flexible printed circuit board such that the motor is rotated in a second direction that is opposite to the first direction.

According to certain embodiments, the variable length unit may further include a first gear (e.g., the first gear 210) connected to the motor, at least one second gear (e.g., the at least one second gear 220) disposed to be engaged with at least a portion of an outer surface of the first gear, and a third gear (e.g., the third gear 230) disposed to be engaged with at least a portion of the at least one second gear to surround the at least one second gear.

According to certain embodiments, the third gear may include a plurality of second bosses (e.g., the plurality of bosses 230) formed on an outer surface thereof to be spaced apart from each other, the first cam may include a plurality of recesses corresponding to the plurality of second bosses, on an inner surface thereof, and a gear assembly, in which the first gear, the at least one second gear, and the third gear are coupled to each other, may be coupled to an interior of the first cam by inserting the plurality of second bosses into the plurality of recesses.

According to certain embodiments, the first gear may be rotated in the first direction in correspondence to the rotation of the motor in the first direction, the at least one second gear may be rotated in the second direction in correspondence to rotation of the first gear in the first direction, the third gear may be rotated in the second direction in correspondence to rotation of the at least one second gear in the second direction, and the first cam may be pressed by the plurality of second bosses as the third gear is rotated in the second direction to be rotated in the second direction.

According to certain embodiments, the second cam may be linearly moved in a third direction that is perpendicular to the first direction or the second direction by the at least one boss that is slid in the at least one slit in correspondence to rotation of the first cam in the second direction, the second cam may be extracted to an outside of the first cam through linear motion thereof in the third direction, and a length of the at least one arm unit may be changed to the first length in correspondence to extraction of the second cam.

According to certain embodiments, the first gear may be rotated in the second direction in correspondence to the rotation of the motor in the second direction, the at least one second gear may be rotated in the first direction in correspondence to rotation of the first gear in the second direction, the third gear may be rotated in the first direction in correspondence to rotation of the at least one second gear in the first direction, and the first cam may be pressed by the plurality of second bosses as the third gear is rotated in the first direction to be rotated in the first direction.

According to certain embodiments, the second cam may be linearly moved in a fourth direction that is opposite to the third direction by the at least one boss that is slid in the at least one slit in correspondence to rotation of the first cam in the first direction, the second cam may be inserted into an interior of the first cam through linear motion thereof in the fourth direction, and a length of the at least one arm unit may be changed to the second length in correspondence to insertion of the second cam.

Various embodiments of the present disclosure described and shown in the drawings are provided as examples to describe technical content and help understanding but do not limit the present disclosure. Accordingly, it should be interpreted that besides the embodiments listed herein, all modifications or modified forms derived based on the technical ideas of the present disclosure are included in the present disclosure.

The invention claimed is:

1. A robot comprising:
   at least one arm unit; and
   a variable length unit coupled to one section of the at least one arm unit,
   wherein the variable length unit includes:
   a motor;
   a first cam having at least one slit with a specific inclination in one area thereof and including a plurality of recesses on an inner surface thereof;
   a second cam, at least a portion of which is disposed in an interior of the first cam, and having at least one first boss that passes through the at least one slit of the first cam;
   a first gear connected to the motor;
   at least one second gear disposed to be engaged with at least a portion of an outer surface of the first gear; and
   a third gear disposed to be engaged with at least a portion of an outer surface of the at least one second gear to surround the at least one second gear, and including a plurality of second bosses formed on an outer surface thereof to be spaced apart from each other,
   wherein the first cam is rotated via the motor,
   wherein the second cam is linearly moved while the at least one first boss is guided by the at least one slit during a rotation of the first cam,
   wherein a length of the at least one arm unit varies according to a linear motion of the second cam, and
   wherein a gear assembly, in which the first gear, the at least one second gear, and the third gear are coupled to each other, is coupled to the interior of the first cam by inserting the plurality of second bosses into the plurality of recesses corresponding to the plurality of second bosses.

2. The robot of claim 1, wherein the first gear is rotated in one direction via the motor,
   wherein the at least one second gear is rotated in an opposite direction to the one direction during a rotation of the first gear in the one direction,
   wherein the third gear is rotated in the opposite direction during a rotation of the at least one second gear in the opposite direction, and
   wherein the first cam is pressed by the plurality of second bosses as the third gear is rotated in the opposite direction to be rotated in the opposite direction.

3. The robot of claim 2, wherein the at least one first boss is slid in the at least one slit responsive to the rotation of the first cam in the opposite direction, and
   wherein the second cam is linearly moved in a direction that is perpendicular to the one direction or the opposite direction based on slide motion of the at least one first boss.

4. The robot of claim 3, wherein the second cam is moved between a location, at which the second cam is extracted to an outside of the first cam, and a location, at which the second cam is inserted into the interior of the first cam, through a linear motion in the direction that is perpendicular to the one direction or the opposite direction.

5. The robot of claim 4, wherein the length of the at least one arm unit is changed to a first length by the second cam that is extracted to the outside of the first cam.

6. The robot of claim 5, wherein the length of the at least one arm unit is changed to a second length that is smaller than the first length by the second cam that is inserted into the interior of the first cam.

7. The robot of claim 1, wherein the variable length unit further includes:
    a plate coupled to at least a portion of an edge of the third gear, and configured to support a gear assembly, in which the first gear, the at least one second gear, and the third gear are coupled to each other.

8. The robot of claim 7, wherein the motor includes a motor shaft, and wherein the motor shaft passes through an opening formed in a central area of the plate and is fixed to a coupling recess formed in a central area of the first gear.

9. The robot of claim 1, wherein the first cam includes a first cylindrical shape, an interior of which is opened, and
    wherein the second cam includes a second cylindrical shape having a diameter that is smaller than a diameter of the first cylindrical shape and an interior of which is opened.

10. The robot of claim 1, wherein a distal end area of one side of the second cam includes at least one coupling member that is coupled to one section of the at least one arm unit.

11. A robot comprising:
    a main printed circuit board;
    a controller electrically coupled to the main printed circuit board;
    at least one arm unit; and
    a variable length unit coupled to one section of the at least one arm unit,
    wherein the variable length unit further includes:
    a motor;
    a flexible printed circuit board coupled to the motor and the main printed circuit board;
    a first cam having at least one slit with a specific inclination in one area thereof and including a first cylindrical shape, an interior of which is opened; and
    a second cam, at least a portion of which is disposed in the interior of the first cam, having at least one first boss that passes through the at least one slit of the first cam, and including a second cylindrical shape having a diameter that is smaller than a diameter of the first cylindrical shape and an interior of which is opened,
    wherein the first cam is rotated via the motor,
    wherein the second cam is linearly moved while the at least one first boss is slid in the at least one slit during a rotation of the first cam, and
    wherein a length of the at least one arm unit is changed according to a linear motion of the second cam.

12. The robot of claim 11, wherein the controller is configured to:
    deliver a first signal to the motor by using the main printed circuit board and the flexible printed circuit board such that the motor is rotated in a first direction; and
    deliver a second signal to the motor by using the main printed circuit board and the flexible printed circuit board such that the motor is rotated in a second direction that is opposite to the first direction.

13. The robot of claim 12, wherein the variable length unit further includes:
    a first gear connected to the motor;
    at least one second gear disposed to be engaged with at least a portion of an outer surface of the first gear; and
    a third gear disposed to be engaged with at least a portion of an outer surface of the at least one second gear to surround the at least one second gear.

\* \* \* \* \*